United States Patent
Beer et al.

(10) Patent No.: US 9,041,505 B2
(45) Date of Patent: *May 26, 2015

(54) SYSTEM AND METHOD FOR A CORELESS TRANSFORMER

(71) Applicant: Infineon Technologies AG, Neubiberg (DE)

(72) Inventors: Gottfried Beer, Nittendorf (DE); Urs Elrod, Regensburg (DE); Christiane Brunner, Regensburg (DE); Thomas Kilger, Regenstauf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/024,395

(22) Filed: Sep. 11, 2013

(65) Prior Publication Data

US 2014/0070913 A1  Mar. 13, 2014

Related U.S. Application Data

(63) Continuation of application No. 13/607,295, filed on Sep. 7, 2012, now Pat. No. 8,552,828.

(51) Int. Cl.
| | |
|---|---|
| *H01F 27/29* | (2006.01) |
| *H01F 5/00* | (2006.01) |
| *H01F 7/06* | (2006.01) |
| *H01F 27/28* | (2006.01) |
| *H01F 41/04* | (2006.01) |

(52) U.S. Cl.
CPC .......... *H01F 27/2804* (2013.01); *H01F 41/041* (2013.01); *H01F 2027/2819* (2013.01)

(58) Field of Classification Search
CPC ............ H01F 17/0013; H01F 17/0006; H01F 27/2804; H01F 27/28; H01F 27/29; H01F 19/04; H01F 5/04; H01F 5/003; H01F 41/10; H01F 41/041
USPC .......... 336/200, 182, 192, 232; 29/602.1, 605
See application file for complete search history.

(56) References Cited

U.S. PATENT DOCUMENTS

| | | | |
|---|---|---|---|
| 5,886,394 A | 3/1999 | Leeuwenburgh | |
| 7,362,205 B2 * | 4/2008 | Ito et al. .................. | 336/200 |
| 7,570,144 B2 | 8/2009 | Lim et al. | |
| 8,054,155 B2 | 11/2011 | Raczkowski | |

(Continued)

OTHER PUBLICATIONS

"ACML-7400, ACML-7410 and ACML-7420, 3.3 V/5 V 100 MBd High Speed CMOS Digital Isolator," Data Sheet, Avago Technologies, www.avagotech.com, May 16, 2011, 13 pages.

(Continued)

*Primary Examiner* — Mangtin Lian
(74) *Attorney, Agent, or Firm* — Slater & Matsil, L.L.P.

(57) ABSTRACT

In accordance with an embodiment, a transformer includes a first coil disposed in a first conductive layer on a first side of a first dielectric layer, and a second coil disposed in a second conductive layer on a second side of the first dielectric layer. Each coil has a first end disposed inside its respective coil and a second end disposed at an outer perimeter of its respective coil. A first crossover disposed in the second conductive layer is directly connected to the first end of the first coil and extends past the outer perimeter of the first coil. In addition, a second crossover disposed in the first conductive layer is directly connected to the first end of the second coil and extends past the outer perimeter of the second coil.

27 Claims, 5 Drawing Sheets

(56) References Cited

U.S. PATENT DOCUMENTS

| | | |
|---|---|---|
| 2005/0116793 A1 | 6/2005 | Shoji |
| 2007/0045773 A1 | 3/2007 | Mi et al. |
| 2009/0284339 A1 | 11/2009 | Choi et al. |
| 2010/0193928 A1 | 8/2010 | Zudock et al. |
| 2011/0241793 A1 | 10/2011 | Frye et al. |

OTHER PUBLICATIONS

"EiceDRIVER, 1 ED02OI12-B2 Single IGBT Driver IC," Preliminary Data Sheet, Rev. 1.0, Apr. 27, 2011, Asic & Power ICs, Infineon Technologies, 29 pages.

Prashant, M. et al., "Next Generation eWLB (embedded Wafer Level BGA) Packaging," STMicroelectronics, Stats ChipPAC Ltd, Infineon Technologies AG, Dec. 8-10, 2010, 8 pages.

Wojnowski, M. et al., "Analysis and Implementation of High-Q Embedded Inductors in Fan-Out eWLB for 6 GHz CMOS VCO," IEEE Transactions on Advanced Packaging, vol. 1, No. 1, Jan. 2010, 13 pages.

Wojnowski, M. et al., "High Frequency Characterization of Thin-Film Redistribution Layers for Embedded Wafer Level BGA," IEEE, 2007 9th Electronics Packaging Technology Conference, Dec. 2007, 7 pages.

Jin, Y. et al., "STM 3D-IC Package and 3D eWLB Development," 12th Electronics Packaging Technology Conference; Dec. 8-10, 2010, Singapore, SEMI, 28 pages.

\* cited by examiner

SYSTEM AND METHOD FOR A CORELESS TRANSFORMER

This is a continuation application of U.S. patent application Ser. No. 13/607,295, entitled "System and Method for a Coreless Transformer" which was filed on Sep. 7, 2012, and which is hereby incorporated herein by reference in its entirety.

TECHNICAL FIELD

This invention relates generally to semiconductor circuits and methods, and more particularly to a system and method for a coreless transformer.

BACKGROUND

In many electronic systems, galvanic isolation is used to isolate different portions of the system from each other. For example, isolation may be used in equipment that is coupled to a data communication line, such as those found in wired local area networks in order to prevent common mode currents due to potential differences between remotely located transceivers. Galvanic isolation may also be used in medical devices that are used to treat or monitor patients in order to safely separate low current circuits from a high-voltage power supply to prevent electric shock. Further, switched-mode power supplies often use galvanic isolation to separate control circuitry from a high-power output. Moreover, connections from one electronic system or sub-system to another electronic system or sub-system often use galvanic isolation to separate the system due to safety reasons.

Generally, discrete transformers and optocouplers are used to transmit signals from one electrical circuit to another electrical circuit without direct electrical contact between the two electrical circuits. However, discrete transformers and optocouplers may be relatively large, heavy, and expensive. In the case of optocouplers, there may be problems related to the aging of optical components.

Another way to transmit signals from one electrical circuit to another electrical circuit without direct electrical contact is to use a coreless transformer. While a discrete transformer comprises a core to direct the magnetic flux, the coils of a coreless transformer may be placed in close proximity to each other to achieve adequate magnetic coupling. In many cases, the coils of the transformer may be separated by a thin dielectric. However, when coils are placed in close proximity to each other, there may be a risk of the dielectric material breaking down in the presence of high voltages, such as those encountered during electrostatic discharge events. There may also be a safety risk associated with having the coils placed in close proximity to each other.

SUMMARY OF THE INVENTION

In accordance with an embodiment, a transformer includes a first coil disposed in a first conductive layer on a first side of a first dielectric layer, and a second coil disposed in a second conductive layer on a second side of the first dielectric layer. Each coil has a first end disposed inside its respective coil and a second end disposed at an outer perimeter of its respective coil. A first crossover disposed in the second conductive layer is directly connected to the first end of the first coil and extends past the outer perimeter of the first coil. In addition, a second crossover disposed in the first conductive layer is directly connected to the first end of the second coil and extends past the outer perimeter of the second coil.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a coreless transformer. Embodiments of the present invention are not limited to coreless transformers, and may also be applied to other types of circuits that utilize inductive elements.

Coreless transformers may be used in applications in which galvanic isolation is necessary to isolate one side of the transformer from another. One way to construct a coreless transformer is to place planar coils within close proximity to each other. This can be done for example, on an integrated circuit or on a substrate in which insulating dielectric layers are interspersed between a plurality of conductive layers. In many applications, however, high-voltage isolation is required, in which case the transformer is designed such that the dielectric isolation between the primary and secondary coil of the transformer does not break down under high-voltage conditions. In some cases, the system in which the transformer is housed may not be configured to operate continually under high-voltage conditions; nevertheless, the coreless transformer may be specified to withstand high voltages, for example, up to 4.5 kV, in the case of e.g. electrostatic discharge.

One way in which coreless transformers have been configured to withstand high voltages is by using many metal layers, and by using dielectric layers that can withstand high voltage conditions. The use of multiple metal layers, however, may be expensive in high-volume, low-cost applications.

Figure 1:
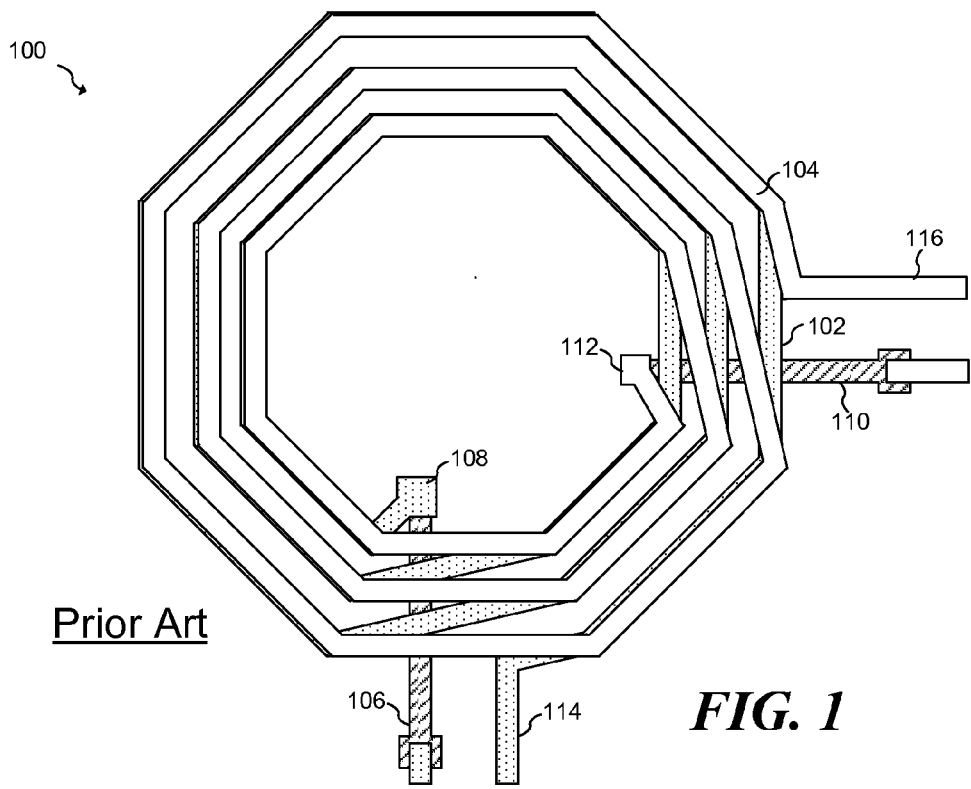
FIG. 1 illustrates a transformer according to the prior art.

FIG. 1 illustrates conventional coreless transformer 100 that has first winding 104 on a first metal layer disposed over second winding 102 on a second metal layer. Line 106 on a third metal layer connects inner winding terminal 108 of second winding 102 to outside the perimeter of second winding 102 alongside outer winding terminal 114. Similarly, line 110 on the third metal layer connects inner winding terminal 112 of first winding 104 to outside the perimeter of first winding 104 alongside outer winding terminal 116. It should be appreciated that coreless transformer 100 requires at least three metals layers and at least two dielectric layers: two metal layers for first and second windings 102 and 104 and at least one metal layer for connecting metal segments 106 and 110.

In an embodiment, a coreless transformer is implemented using only two metal layers and at least one dielectric layer between each of the two metal layers. By geometrically spacing crossover sections such that a minimum distance is maintained between two structures on the same metal layer that may experience a high potential difference, high-voltage isolation may be maintained without dielectric breakdown or device damage.

Figure 2:
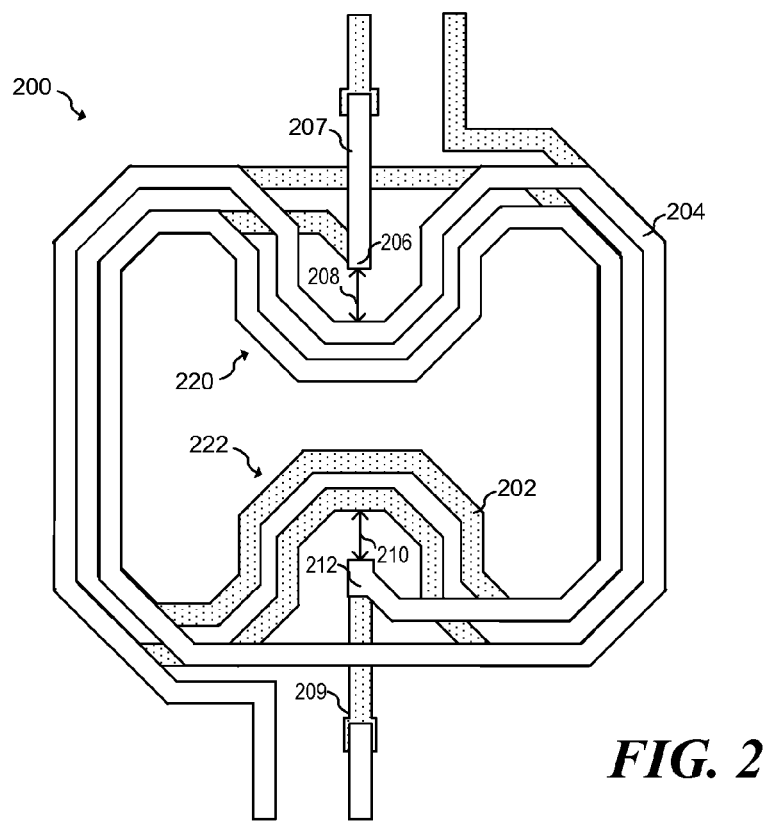
FIG. 2 illustrates an embodiment transformer.

FIG. 2 illustrates coreless transformer 200 according to an embodiment of the present invention. Coreless transformer 200 has first winding 204 on a first metal layer disposed over second winding 202 on a second metal layer. Inner terminal 206 of second winding 202 is brought to the outer perimeter of second winding 202 via metal segment 207 on the first layer of metal. Similarly, inner terminal 212 of first winding 204 is brought to the outer perimeter of first winding 204 via metal segment 209 on the second layer of metal. In an embodiment, inner terminal 206 of second winding 202 is located outside the outer perimeter of first winding 204; inner terminal 212 of first winding 204 is located outside the outer perimeter of second winding 202. Hence, in an embodiment, only two metals layers may be used to implement coreless transformer 200, and an additional metal layer is not required.

In the embodiment of FIG. 2, portion 220 of first winding 204 is shaped such that inner terminal 206 of second winding 202 is disposed outside the perimeter of first winding 204; and portion 222 of second winding 202 is shaped such that inner terminal 212 of first winding 204 is disposed outside the perimeter of second winding 202. It should be appreciated that in alternative embodiments of the present invention, other geometries may be used to position inner winding terminals of one winding outside the perimeter of the other winding.

In an embodiment, lateral dielectric breakdown is prevented by ensuring that portions of windings are kept a minimum distance away from connecting segments on the same metal layer. For example, connecting segment 207 on the first metal layer is kept at least distance 208 from first winding 204; and connecting segment 209 on the second metal layer is kept at least distance 210 from winding 202. In an embodiment, distances 208 and 210 are determined by the properties of the materials, such as a dielectric, that is disposed between the segments.

Figure 3:
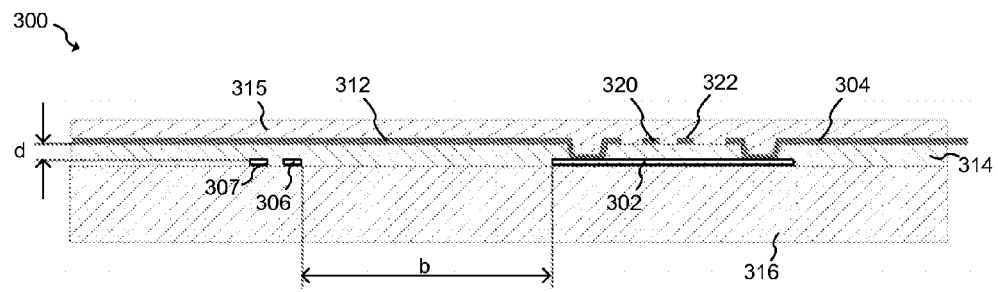
FIG. 3 illustrates a cross-sectional view of an embodiment transformer.

FIG. 3 illustrates cross-section 300 of an embodiment coreless transformer. Cross section 300 shows a first layer of metal that includes inner winding 312, outer windings 320 and 322, and inner winding connection 304 for a top layer coil. A second layer of metal includes windings 306 and 307 of a bottom layer coil. Second layer segment 302 connects inner winding 312 to inner winding connection 304. Cross section 300 also shows top layer dielectric 315, first dielectric layer 314 and bottom layer dielectric 316.

In an embodiment, the voltage breakdown between the first and second coils depends on the vertical dielectric strength of dielectric layer 314 between the top surface of winding 306 and 307 and the bottom surface of inner winding 312. The thickness of this distance is denoted as length "d." The voltage breakdown is also dependent on the horizontal dielectric strength of the interface between dielectric layers 314 and 316 across horizontal distance "b" between winding 306 and second layer segment 302 that connects inner winding 312 to inner winding connection 304. The horizontal dielectric strength per µm is smaller than the vertical dielectric strength due to issues at the interface between dielectric layers 314 and 316. These issues may include contamination, and the potential for delamination due to thermo-mechanical loads caused by mechanisms such as temperature cycling and power cycling. In some embodiments, the ratio of the vertical dielectric strength and the horizontal dielectric strength is a factor of between about 2 and 5. However, this factor may be outside of the range of 2 to 5 in some cases. For example, the range of the ratio may be between 1 and 10 and above. In an embodiment the minimum horizontal distance b is determined by the relationship b=a*d. Typical values for the vertical dielectric strength of dielectric layer 314 may range between about 100 V/µm and about 500 V/µm. Values for polyimide are in the range of about 200 V/µm and about 300 V/µm. Alternatively, there may be dielectrics with vertical dielectric strengths outside of this range also.

In an embodiment, distance "d" may be between about 10 µm to 50 µm, and distance b may be between about 20 µm and about 500 µm, and typically between about 100 µm and about 300 µm for embodiments using chip embedding technologies where a fan out area surrounds the chip. In such embodiments, the first coil and the second coil may withstand voltages of up to e.g. about 2.4 kV. Other distances outside of these ranges may also be used depending on the embodiment and its particular specifications. Chip embedding technologies using in embodiment include, but are not limited to: wafer level packaging in which packaging connections are created directly over the wafer using redistribution layers; technologies such as eWLB in which a fan out area in the redistribution layers extend beyond the perimeter of the die and may surround the die; and other chip embedding technologies, such as "chip in substrate" in which also an area is created surrounding the chip. In some embodiments, this substrate area may be used for a redistribution layer.

Figure 4:
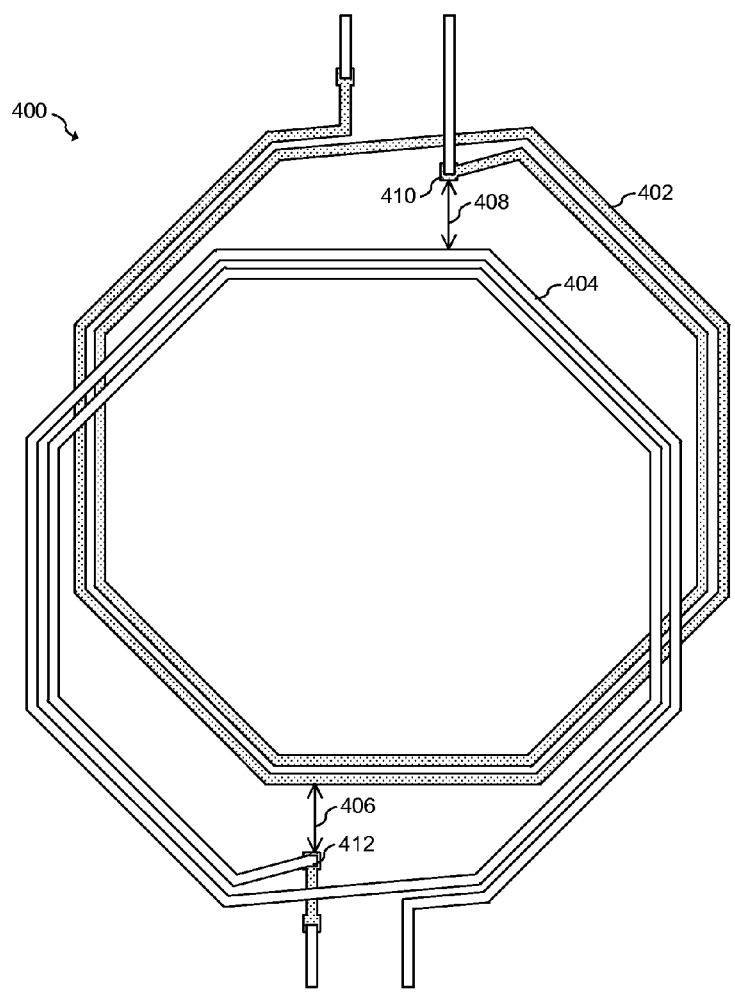
FIG. 4 illustrates transformer according to a further embodiment.

FIG. 4 illustrates coreless transformer 400 according to a further embodiment. Coreless transformer has first coil 404 implemented in a first layer of metal and second coil 402 implemented in a second layer of metal. Coils 402 and 404 are offset from each other such that inner terminal 410 of second coil is at least distance 408 from first coil 404, and inner terminal 412 of first coil 404 is at least distance 406 from second coil 402. Distances 406 and 408 may be determined based on the lateral dielectric strength of dielectric layers used, as well as the high voltage requirements of transformer 400. Distances 406 and 408 may be the same or difference depending on the dielectric layers used. In an embodiment, coils 402 and 404 each have two turns and an octagonal geometry. Alternatively, other geometries may be used and/or greater or fewer turns may be used. In some embodiments, first coil 404 and second coil 402 may have a different number of turns from each other to achieve different coupling ratios.

Figure 5A:
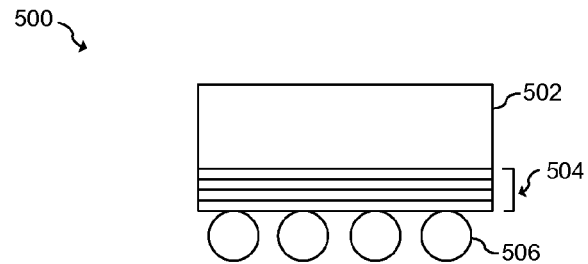
FIGS. 5a-d illustrate embodiment wafer level packages.

FIGS. 5a-d illustrate embodiment wafer-level packages on which embodiment transformers may be implemented. For example, FIG. 5a illustrates wafer level package 500 having redistribution layers 504 disposed beneath integrated circuit 502. Solder balls 506 may be coupled to redistribution layer 506 to implement a wafer level ball grid array (WLB) packages as shown. Alternatively, bump bonds or wire bonds may be used in place of solder balls 506. In further embodiments, any type of embedded package may incorporate embodiment concepts illustrated in FIGS. 5a-d. Embodiment coreless transformers may be fabricated in the layers of redistribution layer 504. In some embodiments, redistribution layer 504 only has two conductive layers and one or more insulating layer, such that the embodiment transformer (not shown) is implemented using only two metal layers as described above.

Figure 5B:
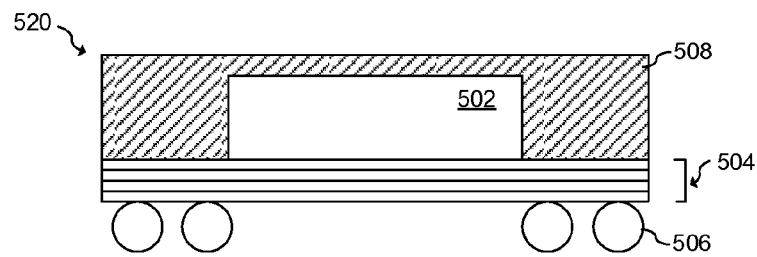

FIG. 5b illustrates embedded chip package 520 having redistribution layer 504 that extends beyond the horizontal dimensions of integrated circuit 502. Encapsulant material 508 may be disposed on integrated circuit 502 and redistribution layer 504. One or more embodiment coreless transformers may be implemented within redistribution layer 504 as described above. In alternative embodiments, embodiment coreless transformers may be implemented in the substrates of packaged parts, substrates of hybrid assemblies, a semiconductor circuit, such as a silicon integrated circuit, or using other structures. In further embodiments, redistribution layer 504 may contain a plurality of transformers.

Figure 5C:
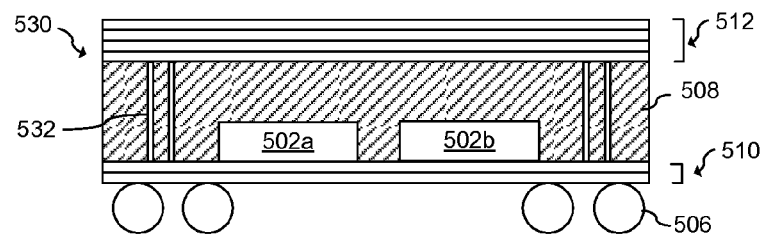

FIG. 5c illustrates embedded chip package 530 having chip 502a and chip 502b disposed within encapsulant material 508 on redistribution layer 510. Further layers 512 including two metal layers and an insulation layer between the metal layers are disposed on top of encapsulant material 508. In an embodiment, redistribution layer 510 routes chip pad connections to solder balls 506 and to through encapsulant vias 532, which are coupled to embodiment transformers disposed in further layers 512. In an embodiment, a transformer in further layers 512 may be used to create a galvanically isolated connection between chip 502a and chip 502b. Encapsulant vias may be formed by attaching a via bar to redistribution layer 510 and then forming encapsulant 508 around the via bar and around chips 502a and 502b. Alternatively, encapsulant 508 may be formed first, after which holes are drilled using, for example, a laser. The holes are then filled with a conductive material, such as metal.

Figure 5D:
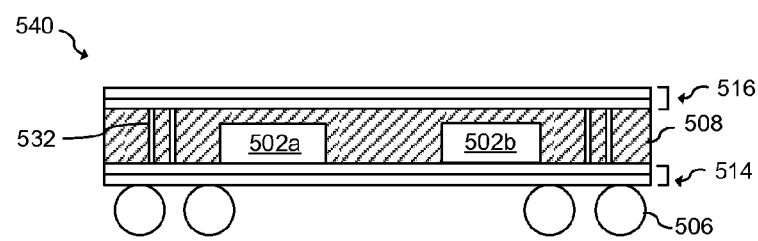

FIG. 5d illustrates embedded chip package 540 having chip 502a and chip 502b disposed within encapsulant material 508 on redistribution layer 540. A top layer 516 including, for example, one metal layer and a passivation layer are disposed on top of encapsulant material 508. In some embodiments, the one metal layer is deposited on top of encapsulant 508, and the passivation layer deposited thereon. Redistribution layer 514 includes a first winding of a transformer and top layer 516 include a second winding of the transformer, which are constructed according to embodiments described herein. Connections to the second winding, including embodiment crossover connections, are implemented using through encapsulant vias 532. Here, encapsulant 508 serves as a dielectric between the first winding and the second winding of the transformer. In some embodiments, encapsulant 508 may be an epoxy material having a filler material such as $SiO_2$. Alternatively, other filler materials may be used. The thickness of encapsulant 508 may range between about 250 μm and about 1000 μm. Alternatively, other thicknesses outside of this range may be used. In some embodiments, packaging may be implemented using systems and methods described in U.S. Pat. No. 8,093,711, which is incorporated by reference herein in its entirety.

Figure 6A:
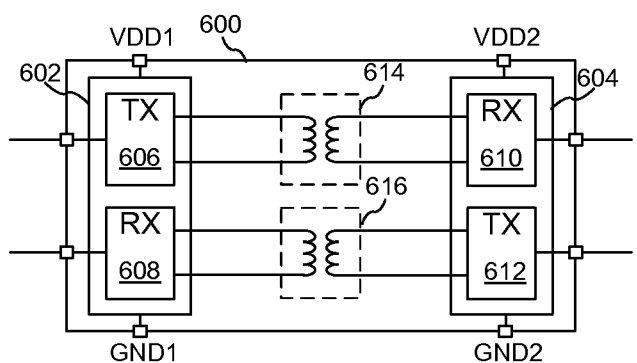
FIGS. 6a-b illustrate embodiment isolated transceivers.
Figure 6B:
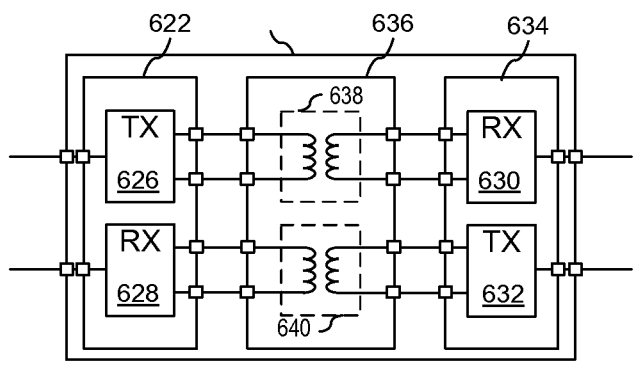

FIGS. 6a and 6b illustrate embodiment isolated transceivers. FIG. 6a illustrates isolated transceiver integrated circuit 600 having first transceiver 602 comprising transmitter 606 and receiver 608; and second transceiver 604 comprising receiver 610 and transmitter 612. In an embodiment, transmitter 606 of first transceiver 602 is coupled to receiver 610 of second transceiver 604 via transformer 614. Similarly, transmitter 612 of second transceiver 604 is coupled to receiver 608 of first transceiver 608 via transformer 616. First transceiver 602 is referenced to supply nodes VDD1 and GND1 and second transceiver 604 is referenced to supply nodes VDD2 and GND2. In an embodiment, supply nodes VDD1 and GND1 may be coupled to a first power supply or a first electronic system or sub-system), and supply nodes VDD2 and GND2 may be coupled to a second power supply or a second electronic system or sub-system that is isolated from the first power supply.

Transformers 614 and 616 may be implemented using coreless transformers according to embodiments described above. In an embodiment, transformers 614 and 616 are implemented using only two metals layers and at least one dielectric layer of integrated circuit 600. In an embodiment, the at least one dielectric layer may be a $SiO_2$ layer.

FIG. 6b illustrates isolated transceiver module 620 having first transceiver circuit 622, second transceiver circuit 634 and transformer circuit 636. Transmitter 626 of first transceiver 622 is coupled to receiver 630 of second transceiver 634 via transformer substrate 638. Similarly, transmitter 632 of second transceiver 634 is coupled to receiver 628 of first transceiver 622 via transformer 640. In an embodiment, first and second transceivers may be implemented using integrated circuits, and transformer substrate may be implemented on a printed circuit board (PCB) or hybrid substrate on which circuits 622 and 634 are disposed.

Figure 7:
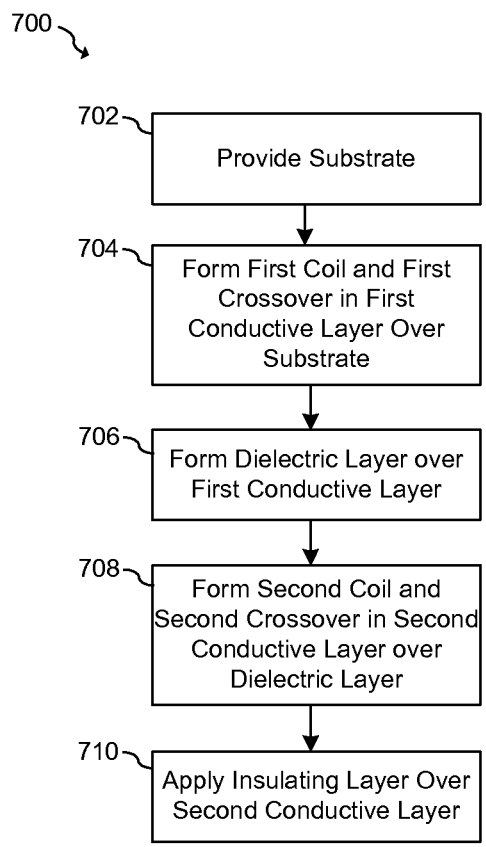
FIG. 7 illustrates a flowchart of a method of forming an embodiment transformer.

FIG. 7 illustrates flowchart 700 of a method of forming an embodiment transformer. First, in step 702, a substrate is provided, which may be a semiconductor substrate, a fan out wafer level package, a hybrid, a PCB or other substrate. A first coil and a first crossover for the second coil is formed in a first conductive layer over the substrate (step 704). The first conductive layer may be formed from a metal such as aluminum or copper using techniques known in the art. Alternatively, other conductive materials may be used. Step 704 may be performed by semi additive, subtractive processing, contactive printing or any other processing. Next, in step 706, a dielectric material, such as $SiO_2$, polymer material or other insulating material, is formed over the first conductive layer with openings on relevant positions. A second coil and a second crossover for the first coil is then formed in a second conductive layer over the dielectric material (step 708). The second crossover for the first coil is coupled to an interior end of the first coil and extends past the perimeter of the first coil. Likewise, the first crossover for the second coil coupled to an interior end of the second coil and extends past an outer perimeter of the second coil. An optional insulating material, such as a nitride passivation, polymer material or other insulating material may be formed over the second conductive layer in step 710.

In accordance with an embodiment, a transformer includes a first dielectric layer, a first coil disposed in a first conductive layer on a first side of the first dielectric layer, and a second coil disposed in a second conductive layer on a second side of the first dielectric layer opposite the first side. The first coil has a first end disposed inside the first coil, and a second end disposed at an outer perimeter of the first coil, and the second coil has a first end disposed inside the second coil, and a second end disposed at an outer perimeter of the second coil. The transformer also has a first crossover disposed in the second conductive layer, and a second crossover disposed in the first conductive layer. The first crossover is directly connected to the first end of the first coil and extends past the outer perimeter of the first coil; and the second crossover is directly connected to the first end of the second coil and extends past the outer perimeter of the second coil.

The first end of the second coil may be disposed outside the outer perimeter of the first coil; and the first end of the second coil may be disposed outside the outer perimeter of the second coil. In some embodiments, a first lateral distance between the first crossover and a nearest portion of the second coil is not less than a first critical distance; and a second lateral distance between the second crossover and a nearest portion of the first coil is not less than a second critical distance. The first critical distance and the second critical distance may be a same distance, or they may be a different distance. In an embodiment, the first critical distance is between about 2 and about 5 times a width of the first dielectric layer. Alternatively, critical distances outside of this range may also be used.

In some embodiments, the transformer is configured to withstand a potential difference of at least 2.5 kV between the first coil and the second coil. In further embodiments, the transformer may be configured to withstand a higher voltage, such as 4.5 kV between the first coil and the second coil. In an embodiment, the first coil and the second coil may be implemented using a spiral inductor and/or the first coil and the second coil may each include at least two turns. In some embodiments, the first conductive layer, the first dielectric layer and the second conductive layer are disposed on an integrated circuit.

In an embodiment, the first conductive layer, the first dielectric layer and the second conductive layer comprise layers in a wafer level package. The wafer level package may include only two conductive layers and at least one non-conductive layer, such that the only two conductive layers are the first conductive layer and the second conductive layer. In some embodiments, the wafer level package comprises at least one integrated circuit disposed on the second metal layer.

In an embodiment, the wafer level package includes a redistribution layer, at least one integrated circuit disposed on the redistribution layer, and an encapsulating layer disposed over the at least one integrated circuit, such that the first conductive layer is disposed over the encapsulating layer. The wafer level package may further include through encapsulant vias coupling the redistribution layer with the first conductive layer and the second conductive layer. In another embodiment, the wafer level package includes at least one integrated circuit disposed over the first metal layer, wherein the first dielectric layer is formed as an encapsulating layer disposed over the at least one integrated circuit, and the second conductive layer is formed over the encapsulating layer.

In accordance with a further embodiment, a wafer level package includes a first dielectric layer, a first conductive layer disposed on a first side of the first dielectric layer, and a second conductive layer disposed on a second side of the first dielectric layer, such that the second side opposite the first side. The wafer level package also includes a first coil disposed in the first conductive layer, and a second coil disposed in the second conductive layer. The first coil includes a first end disposed inside the first coil, and a second end disposed at an outer perimeter of the first coil Likewise, the second coil includes a first end disposed inside the second coil, and a second end disposed at an outer perimeter of the second coil. A first crossover is disposed in the second conductive layer, and a second crossover is disposed in the first conductive layer. The first crossover is directly connected to the first end of the first coil and extends past the outer perimeter of the first coil, and the second crossover is directly connected to the first end of the second coil and extends past the outer perimeter of the second coil. In an embodiment, the first coil and the second coil form a transformer. The transformer may be an isolation transformer configured to withstand a potential difference of at least 2.5 kV between the first coil and the second coil.

In an embodiment, the first end of the second coil is disposed outside the outer perimeter of the first coil, and the first end of the second coil is disposed outside the outer perimeter of the second coil. In some embodiments, a first lateral distance between the first crossover and a nearest portion of the second coil is not less than a first critical distance, and a second lateral distance between the second crossover and a nearest portion of the first coil is not less than a second critical distance. The first critical distance may be the same as or different from the second critical distance.

In an embodiment, the wafer level package also includes an integrated circuit coupled to the first coil. The wafer level package may include redistribution layers having only two conductive layers and at least one non-conductive layer, wherein the only two conductive layers comprise the first conductive layer and the second conductive layer. In an embodiment, at least one integrated circuit is disposed over the second conductive layer, and an encapsulating material is disposed over the at least one integrated circuit. The first coil and the second coil may be disposed in a fan out area of the wafer level package.

In an embodiment, the wafer level package further includes at least one integrated circuit disposed over the first conductive layer, wherein the first dielectric layer comprises an encapsulating material disposed over the at least one integrated circuit. The wafer level package may also include through encapsulant vias coupling the first conductive layer and the second conductive layer at the first crossover and at the second crossover.

In an embodiment, the wafer level package further includes at least one integrated circuit disposed over a redistribution layer, and an encapsulating material disposed over the at least one integrated circuit, such that the first conductive layer, first dielectric layer, and second conductive layer are disposed over the encapsulating material.

In accordance with a further embodiment, a method of forming a transformer forming a second coil in a second conductive layer, forming a first crossover in the second conductive layer, forming a first dielectric layer over the second conductive layer, forming a first coil in a first conductive layer disposed over the first dielectric layer, and forming a second crossover in the first conductive layer. The first coil includes a first end disposed inside the first coil, and a second end disposed at an outer perimeter of the first coil; and the second coil includes a first end disposed inside the second coil, and a second end disposed at an outer perimeter of the second coil. The first crossover is coupled to the first end of the first coil and extends past the outer perimeter of the first coil; and the second crossover is coupled to the first end of the second coil and extends past the outer perimeter of the second coil. In an embodiment, wherein forming the second conductive layer includes forming a wafer level package including only two conductive layers and at least one non-conductive layer that include the first conductive layer and the second conductive layer, and the first dielectric layer.

Advantages of embodiment systems and methods include the ability to implement coreless transformers that can withstand high voltages using only two metal layers, thereby allowing for low-cost and compact isolation transformers.

Further advantages include improvement of yield by reducing the number of layers and reducing the number of processes required to fabricate layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A transformer comprising:
    a first coil disposed in a first conductive layer in a first plane, the first coil comprising a first end disposed inside the first coil;
    a second coil disposed in a second conductive layer in a second plane substantially parallel to the first plane a first distance in a vertical direction from the first coil, the second coil comprising a first end disposed inside the second coil;
    a first crossover disposed in the second conductive layer, the first crossover directly connected to the first end of the first coil and extending past an outer perimeter of the first coil; and
    a second crossover disposed in the first conductive layer, the second crossover directly connected to the first end of the second coil and extending past an outer perimeter of the second coil.

2. The transformer of claim 1, wherein a center of the first coil is laterally offset from a center of the second coil.

3. The transformer of claim 2, wherein a majority of a surface area of the first coil is not disposed directly opposite from a majority of a surface area of the second coil in the vertical direction.

4. The transformer according to claim 1, wherein:
    the first end of the second coil is disposed outside the outer perimeter of the first coil; and
    the first end of the second coil is disposed outside the outer perimeter of the second coil.

5. The transformer according to claim 1, wherein:
    a first lateral distance between the first crossover and a nearest portion of the second coil is not less than a first critical distance; and
    a second lateral distance between the second crossover and a nearest portion of the first coil is not less than a second critical distance.

6. The transformer according to claim 1, wherein the first coil and the second coil each comprise at least two turns.

7. The transformer of claim 1, further comprising a first dielectric layer disposed between the first coil and the second coil.

8. The transformer according to claim 7, wherein the first conductive layer, the first dielectric layer and the second conductive layer comprise layers in an embedded package.

9. The transformer of claim 7, wherein the first dielectric layer comprises a polymer material.

10. The transformer according to claim 1, wherein the first conductive layer and the second conductive layer are disposed on an integrated circuit.

11. An embedded package comprising:
    a first coil disposed in a first conductive layer in a first plane, the first coil comprising a first end disposed inside the first coil;
    a second coil disposed in a second conductive layer in a second plane substantially parallel to the first plane a first distance in a vertical direction from the first coil, the second coil comprising a first end disposed inside the second coil;
    a first crossover disposed in the second conductive layer, the first crossover directly connected to the first end of the first coil and extending past an outer perimeter of the first coil; and
    a second crossover disposed in the first conductive layer, the second crossover directly connected to the first end of the second coil and extending past an outer perimeter of the second coil.

12. The embedded package of claim 11, further comprising a first dielectric layer disposed between the first coil and the second coil.

13. The embedded package according to claim 12, further comprising at least one integrated circuit disposed over the first conductive layer, wherein the first dielectric layer comprises an encapsulating material disposed over the at least one integrated circuit.

14. The embedded package of claim 11, wherein a center of the first coil is laterally offset from a center of the second coil.

15. The embedded package of claim 14, wherein a majority of a surface area of the first coil is not disposed directly opposite from a majority of a surface area of the second coil in the vertical direction.

16. The embedded package according to claim 11, further comprising an integrated circuit coupled to the first coil.

17. The embedded package according to claim 11, wherein, wherein the embedded package comprises a redistribution layer having only two conductive layers and at least one non-conductive layer disposed between the only two conductive layers, wherein the only two conductive layers comprise the first conductive layer and the second conductive layer.

18. The embedded package according to claim 11, further comprising:
    at least one integrated circuit disposed over the second conductive layer; and
    an encapsulating material disposed over the at least one integrated circuit.

19. A method of forming a transformer, the method comprising:
    forming a second coil in a second conductive layer;
    forming a first crossover in the second conductive layer;
    forming a first coil in a first conductive layer over the second conductive layer, wherein the first conductive layer is disposed over the second conductive layer at a first distance; and
    forming a second crossover in the first conductive layer, wherein:
        the first coil comprises a first end disposed inside the first coil,
        the second coil comprises a first end disposed inside the second coil,
        the first crossover is coupled to the first end of the first coil and extends past an outer perimeter of the first coil, and
        the second crossover is coupled to the first end of the second coil and extends past an outer perimeter of the second coil.

20. The method of claim 19, further comprising forming a first dielectric layer over the second conductive layer, wherein forming the first coil comprises forming the first coil over the first dielectric layer.

21. The method of claim 19, wherein:
    forming the second coil further comprises forming the second coil on a first side of a first dielectric layer; and forming the first coil comprises forming the first coil on a second side of the first dielectric layer opposite the first side.

22. The method of claim 21, wherein the first dielectric comprises a polymer material.

23. The method according to claim 19, further comprising forming an embedded package comprising only two conductive layers and at least one non-conductive layer that includes the first conductive layer and the second conductive layer, and a first dielectric layer disposed between the first conductive layer and the second conductive layer.

24. The transformer of claim 7, wherein:
the transformer is coupled to a transceiver disposed on a same integrated circuit as the transformer; and
a majority of a surface area of the first coil in the first conductive layer on a first side of the first dielectric layer is disposed directly opposite from a majority of a surface area of the second coil disposed on a second side of the first dielectric layer.

25. The transformer of claim 7, wherein:
the transformer is coupled to a transceiver that is disposed on a same integrated circuit as the transformer; and
the first coil is laterally offset from the second coil, and
a majority of a surface area of the first coil in the first conductive layer on a first side of the first dielectric layer is not disposed directly opposite from a majority of a surface area of the second coil disposed on a second side of the first dielectric layer.

26. The transformer of claim 7, wherein:
the transformer is coupled to a transceiver that is disposed on an integrated circuit that separate from the transformer; and
a majority of a surface area of the first coil in the first conductive layer on a first side of the first dielectric layer is disposed directly opposite from a majority of a surface area of the second coil disposed on a second side of the first dielectric layer.

27. The transformer of claim 7, wherein:
the transformer is coupled to a transceiver that is disposed on an integrated circuit that separate from the transformer; and
the first coil is laterally offset from the second coil, and
a majority of a surface area of the first coil in the first conductive layer on a first side of the first dielectric layer is not disposed directly opposite from a majority of a surface area of the second coil disposed on a second side of the first dielectric layer.

\* \* \* \* \*

UNITED STATES PATENT AND TRADEMARK OFFICE
CERTIFICATE OF CORRECTION

| | | |
|---|---|---|
| PATENT NO. | : 9,041,505 B2 | Page 1 of 1 |
| APPLICATION NO. | : 14/024395 | |
| DATED | : May 26, 2015 | |
| INVENTOR(S) | : Gottfried Beer | |

It is certified that error appears in the above-identified patent and that said Letters Patent is hereby corrected as shown below:

In the claims

In Col. 12, line 15, claim 27, immediately following "integrated circuit that" insert --is--.

Signed and Sealed this
Seventeenth Day of November, 2015

Michelle K. Lee
*Director of the United States Patent and Trademark Office*